United States Patent [19]

Urabe et al.

[11] Patent Number: 5,230,989

[45] Date of Patent: Jul. 27, 1993

[54] DEVELOPER FOR PS PLATE REQUIRING NO DAMPENING WATER

[75] Inventors: Yoshihiko Urabe; Susumu Yoshida; Nobuyuki Kita, all of Shizuoka, Japan

[73] Assignee: Fuji Photo Film Co., Ltd., Minami-Ashigara, Japan

[21] Appl. No.: 651,628

[22] Filed: Feb. 6, 1991

[30] Foreign Application Priority Data

Feb. 7, 1990 [JP] Japan ..... 2-27859

[51] Int. Cl.$^5$ ............ G03F 7/30; G03F 7/32
[52] U.S. Cl. ............... 430/303; 430/309; 430/331; 430/272; 101/463.1; 101/467
[58] Field of Search ........ 430/303, 302, 309, 331, 430/272; 101/467, 453, 456, 457, 463.1, 467

[56] References Cited

U.S. PATENT DOCUMENTS

| | | | |
|---|---|---|---|
| 4,378,423 | 3/1983 | Suezawa et al. | 430/303 |
| 4,535,054 | 8/1985 | Brault et al. | 430/331 |
| 4,587,203 | 5/1986 | Brault et al. | 430/331 |
| 4,878,986 | 11/1989 | Nishikawa | 156/159 |
| 4,959,296 | 9/1990 | Yoshida et al. | 430/302 |
| 5,102,573 | 4/1992 | Han et al. | 252/171 |

FOREIGN PATENT DOCUMENTS

| | | |
|---|---|---|
| 0336400 | 10/1989 | European Pat. Off. |
| 0400657 | 12/1990 | European Pat. Off. ............ 430/331 |
| 3543961 | 6/1986 | Fed. Rep. of Germany ...... 101/453 |

*Primary Examiner*—Marion E. McCamish
*Assistant Examiner*—Janis L. Dote
*Attorney, Agent, or Firm*—Burns, Doane, Swecker & Mathis

[57] ABSTRACT

A developer for a presensitized plate for use in making a lithographic printing plate requiring no dampening water comprises: (1) 1 to 39% by weight of at least one alcohol derivative selected from the group consisting of those represented by the following general formula (I):

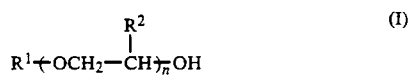

(wherein $R^1$ represents an alkyl or alkenyl group having 4 to 12 carbon atoms; $R^2$ represents a hydrogen atom or a methyl group; and n is an integer ranging from 1 to 6); (2) 1 to 39% by weight of at least one water-soluble organic solvent having a boiling point of not less than 100° C.; and (3) 60 to 98% by weight of water. If this developer is used, foaming is hardly caused during the development processing a PS plate requiring no dampening water, it has excellent developing ability and half tone dot reproduction and can provide an excellent lithographic printing plate free of defects such as scratch marks.

17 Claims, No Drawings

DEVELOPER FOR PS PLATE REQUIRING NO DAMPENING WATER

BACKGROUND OF THE INVENTION

The present invention relates to a developer for a presensitized plate (hereunder referred to as "PS plate requiring no dampening water") for use in making a lithographic printing plate which does not require dampening water during printing and which comprises a silicone rubber layer serving as an ink repellent layer (hereunder referred to as "lithographic plate requiring no dampening water") and in particular to a developer for a PS plate requiring no dampening water which is excellent in particular in developing ability and half tone dot reproduction and which hardly causes foaming.

There have already been proposed a variety of PS plates requiring no dampening water which comprise, as an ink repellent layer, a silicone rubber layer. Among these, particularly preferred are those comprising a substrate provided thereon with, in order, a light-sensitive resin layer and a silicone rubber layer, specific examples of which are those disclosed in, for instance, Japanese Patent Publication for Opposition Purpose (hereinafter referred to as "J.P. KOKOKO") Nos. Sho 54-26923 (U.S. Pat. No. 3,894,873) and Sho 55-22781 (Brit. Pat. 1,419,643).

These PS plates requiring no dampening water can be roughly divided into two groups, one of which are those disclosed in, for instance, J.P. KOKOKU Nos. Sho 42-21879, Sho 46-16044(U.S. Pat. No. 3,511, 178) and Sho 55-22781 and Japanese Patent Unexamined Publication (hereunder referred to as "J.P. KOKAI") Nos. 49-86103 and Sho 49-68803 and whose non-exposed portions (image areas) are dissolved by a developer and in which the silicone rubber layer on the image areas is accordingly removed and the other of which are those disclosed in, for instance, J.P. KOKOKU Nos. Sho 54-26923, Sho 56-23150 and Sho 56-12861 and whose exposed portions (non-image areas) are firmly adhered to the light-sensitive layer through photoadhesion and in which only the silicone rubber layer on the non-exposed portions (image areas) is removed by the action of an organic solvent capable of swelling only the silicone rubber layer on the non-exposed areas.

Though these PS plate requiring no dampening water can be developed with an appropriate organic solvent, developers mainly comprising water have been proposed for eliminating any possibility of firing (see, for instance, J.P. KOKAI No. Hei 1-159644 (U.S. Pat. No. 4,959,296) and Japanese Patent Application Serial (hereunder referred to as "J.P A.") No. Hei 1-139558(EP 0400657A)).

However, these developers mainly comprising water are those obtained by dissolving a solvent hardly soluble in water with the aid of a surfactant and correspondingly they cause foaming during developing operations. Thus, if they are used in an automatic developing machine, the solution overflows from a tank due to the foaming. Moreover, the surfactant does not swell or dissolve a light-sensitive layer at all, accordingly the developing ability of the developer is not improved by the addition of a surfactant and the addition thereof simply leads to the reduction in the water content. Therefore, the developing ability thereof is not good although water content is rather high.

SUMMARY OF THE INVENTION

Accordingly, the object of the present invention is to provide a developer for PS plates requiring no dampening water which mainly comprises water, but is free of a surfactant, which is excellent in developing ability and half tone dot reproduction and which never causes severe foaming.

The inventors of this invention have conducted intensive studies to achieve the foregoing object, have found out that the desired developer can be obtained if a specific alcohol derivative is dissolved in water in a predetermined amount with the aid of an organic solvent which can dissolve or swell a part of a lightsensitive layer and having a specific boiling point, and have completed the present invention on the basis of this finding.

According to the present invention, the foregoing object can be effectively be accomplished by providing a developer for PS plates requiring no dampening water which comprises:

(1) 1 to 39% by weight of at least one alcohol derivative selected from the group consisting of those represented by the following general formula (I):

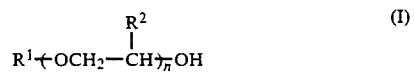

(wherein $R^1$ represents an alkyl or alkenyl group having 4 to 12 carbon atoms; $R^2$ represents a hydrogen atom or a methyl group; and n is an integer ranging from 1 to 6);

(2) 1 to 39% by weight of at least one water-soluble organic solvent having a boiling point of not less than 100° C.; and (3) 60 to 98% by weight of water.

DESCRIPTION OF THE PREFERRED EMBODIMENTS

The developer for PS plates requiring no dampening water according to the present invention will hereunder be explained in more detail.

The developer of the present invention is an aqueous solution obtained by solubilizing the alcohol derivative (1) of Formula (I) in water (3) with the aid of the water-soluble organic solvent (2) having a boiling point of not less than 100° C.

Specific examples o the foregoing alcohol derivatives (1) include diethylene glycol-mono-n-pentyl ether, diethylene glycol-mono-n-hexyl ether, diethylene glycol-mono-n-heptyl ether, diethylene glycol-mono-octyl ether, ethylene glycol-mono-n-Pentyl ether, ethylene glycol-mono-n-hexyl ether, ethylene glycol-mono-n-heptyl ether, ethylene glycol-mono-octyl ether, propylene glycol-mono-butyl ether, propylene glycol-mono-pentyl ether, propylene glycol-mono-n-hexyl ether, propylene glycol-mono-heptyl ether, propylene glycol-mono-octyl ether, dipropylene glycol-mono-butyl ether, dipropylene glycol-mono-pentyl ether, dipropylene glycol-mono-n-hexyl ether, dipropylene glycol-mono-octyl ether and dipropylene glycol-mono-octenyl ether.

Specific examples of the water-soluble organic solvents (2) are glycerin, ethylene glycol, diethylene glycol, propylene glycol, dipropylene glycol, tripropylene glycol, diethylene glycol mono-methyl ether, 1,2-butanediol, 1,3-butanediol, 1,4-butanediol, carbitol, lactic acid, acetic acid, triethyl phosphate, methyl lactate and ethyl lactate.

The alcohol derivative Of Formula (I) is a developing agent (which ensures the developing ability of the foregoing aqueous solution). Thus, if the amount thereof is less than 1% by weight, the aqueous solution does not exhibit any developing ability, while if it exceeds 39% by weight, the water content of the developer is limited to not more than 60% by weight, the desired properties as an aqueous developer cannot be obtained and the resulting developer falls within the scope of explosive compounds or dangerous substances as prescribed in the Fire Services Act (i.e., firing is possibly caused).

In addition, if the amount of the water-soluble organic solvent is less than 1% by weight, the solubilization of the foregoing alcohol derivative in water becomes difficult, while if it exceeds 39% by weight, the same problem as described above in connection with the alcohol derivative arises.

A surfactant may simultaneously be used, if necessary, as a solubilizing agent for the foregoing alcohol derivatives in order to control the strength of developing ability. As such surfactants for solubilizing the alcohol derivatives, there may be used any surfactants such as anionic, non-ionic, cationic and amphoteric surfactants, but in particular anionic surfactants are preferably employed in the invention.

The amount of these surfactants in general ranges from 0.01 to 20% by weight on the basis of the total weight of the developer. It is a matter of course that the amount thereof is desirably as low as possible and most preferably zero.

There may optionally be added to the developer the following compounds depending on the kinds of the photopolymerizable adhesive layers of PS plates to be treated in order to enhance the developing ability of the developer. Specific examples of such compounds are organic acids such as propionic acid, n-butyric acid, iso-butyric acid, n-valeric acid, iso-valeric acid, methylethyl acetic acid, trimethyl acetic acid, caproic acid, isocaproic acid, α-methylvaleric acid, 2 ethyl-n-butyric acid, enanthic acid, caprylic acid and 2-ethylhexanoic acid; and amine compounds such as methylamine, ethylamine, dimethylamine, trimethylamine, triethylamine, propylamine, butylamine, amylamine, dipropylamine, dibutylamine, diamylamine, tripropylamine, tribuylamine, methyldiethylamine, ethylenediamine, trimethylenediamine, tetramethylenediamine, benzylamine, N,N-dimethylbenzylamine, N,N-diethylbenzylamine, o-, m- and p-methoxy (or methyl)benzylamine, N,N-di-(methoxybenzyl)amine, β-phenylethylamine, γ-phenylpropylamine, cyclohexylamine, α- or β -naphthylamine, o-, m- and p-phenylenediamine, monoethanolamine, diethanolamine, triethanolamine, 2-methylaminoethanol, 2-ethylaminoethanol, 2-(2-aminoethyl)ethanol, 2-amino-2-methyl-1,3-propanediol, 2-amino-1,3-propanediol, 2-amino-2-hydroxymethyl-1,3-propanediol, 3-methoxypropylamine, 3-ethoxypropylamine, 3-propoxypropylamine, 3-isopropoxypropylamine, 3-butoxypropylamine, 3-isobutoxypropylamine, 2-ethylhexyloxypropylamine, 2-ethoxyethylamine, 2-propoxyethylamine and 2-butoxyethylamine.

In addition to the foregoing components, the developer may further comprise a dye such as Crystal Violet and Astrazone Red for dyeing image portions simultaneously with the development.

The PS plates requiring no dampening water which can be developed with the developer of the present invention are those comprising silicone rubber layer as an ink repellent layer, in particular those comprising a substrate provided thereon with, in order, a light-sensitive layer and a silicone rubber layer.

The substrate for PS plates requiring no dampening water must have flexibility sufficient for fitting it on the usual lithographic printing press and must withstand load applied during printing operations. Typical examples of such substrates are coated paper, metal plates such as steel, iron, aluminum and aluminum alloy plates, plastic films such as polyethylene terephthalate film, and paper or plastic films which are laminated with a sheet of the foregoing metal or to which one of the foregoing metal is deposited. Particularly preferred are aluminum plates because of their extremely high dimensional stability and cheapness.

A primer layer or the like may optionally be applied onto the surface of these substrate for the purpose of forming a light-sensitive layer, as will be described below, having a uniform thickness and/or for improving the adhesion between the light-sensitive layer and the substrate.

As materials for the primer layer, there may be mentioned, for instance, those comprising an epoxy resin as disclosed in J.P. KOKOKU No. Sho 61-54219, or urethane resins, phenol resins, acrylic resins, alkyd resins, polyester resins, polyamide resins or melamine resins. Alternatively, the primer layer may also be formed by photohardening a composition similar to the light-sensitive layer. The primer layer may comprise dyes and/or pigments for the purpose of inhibiting halation and for other purposes.

The thickness of the primer layer preferably ranges from 1 to 50 $g/m^2$ expressed in terms of the coated amount.

In the present invention, any light-sensitive layers may be processed with the developer of the invention so far as the solubility thereof in the developer is changed or the adhesion at the interface between the light-sensitive layer and the upper silicone rubber layer is changed through the irradiation with light rays. Therefore, the light-sensitive layer may be either negative-working or positiveworking type ones.

Compounds or composition for forming such light-sensitive layers are, for instance, those listed below:

(A) Photopolymerizable Light-sensitive Resin Layer

Layers of this kind can be obtained from a photopolymerizable composition which comprises (i) a monomer or an oligomer having an olefinically unsaturated double bond, (ii) an optional polymeric compound having film-forming ability and (iii) a photopolymerization initiator.

Among the light-sensitive resin layers comprising the foregoing components (i) to (iii), preferably used in the present invention are light-sensitive resin layers which comprise a polymeric compound obtained by combining the components (i) and (ii), more specifically a polymeric compound having, on the side chains, photopolymerizable or photocrosslinkable and olefinically unsaturated double bonds and having film-forming ability. Moreover, light-sensitive resin layers which comprise a compound obtained by combining the foregoing components (i) and (ii) and a monomer or an oligomer (i) are more preferably used in the invention. However, the present invention is not restricted to these specific examples at all.

Component (i): Monomers or Oligomers Having Olefinically Unsaturated Double Bond Specific examples of such monomers and oligomers include monofunctional acrylates or methacrylates such as polyethylene glycol mono(meth)acrylate, polypropylene glycol mono(meth)acrylate, phenoxyethyl (meth)acrylate; polyethylene glycol di(meth)acrylate, trimethylolethane tri(meth)acrylate, neopentyl glycol di(meth) acrylate, pentaerythritol tri(meth)acrylate, pentaerythritol tetra(meth)acrylate, dipentaerythritol hexa(meth)acrylate, hexanediol di(meth)acrylate, trimethylolpropane tri(acryloyloxypropyl) ether, tri(acryloyloxyethyl) isocyanurate, calcium (meth)acrylate, sodium (meth)acrylate, those obtained by adding ethylene oxide or propylene oxide to polyfunctional alcohols such as glycerin and trimethylolethane and then converting the adducts into (meth)acrylates, urethane acrylates such as those described in J.P. KOKOKU Nos. Sho 48-41708 and Sho 50-6034 and J.P. KOKAI No. Sho 51-37193, polyester acrylates such as those disclosed in J.P. KOKAI No. Sho 48-64183 and J.P. KOKOKU Nos. Sho 49-43191 and Sho 52-30490, polyfunctional acrylates and methacrylates such as those obtained by reacting epoxy resins with (meth)acrylic acid, and N-methylolacrylamide derivatives as disclosed in U.S. Pat. No. 4,540,649. Moreover, those listed in Bulletin of Japan Adhesives Society, 1984, 20, No. 7, pp. 300-308 as photohardenable monomers and oligomers may be effectively used in the present invention. These monomers and oligomers are used in the light-sensitive layer in an amount ranging from 70 to 1% by weight and preferably 50 to 3% by weight on the basis of the total weight of the light-sensitive resin layer.

Component (ii): Polymeric Compounds Having Film-Forming Ability

Specific examples of such polymeric compounds having film-forming ability are methacrylic acid copolymers, acrylic acid copolymers, crotonic acid copolymers, maleic acid copolymers, partially esterified maleic acid copolymers, acidic cellulose derivatives, polyvinyl pyrrolidone, polyethylene oxides, alcohol-soluble nylons, polyesters, unsaturated polyesters, polyurethanes, polystyrene, epoxy resins, phenoxy resins, polyvinyl butyral, polyvinyl formal, polyvinyl chloride, polyvinyl alcohols, polyvinyl alcohols partially modified with acetal, water-soluble nylons, water-soluble urethane resins, gelatin and water-soluble cellulose derivatives.

Polymeric Compounds Obtained by Combining Components (i) and (ii)

Specific examples of such polymeric compounds are copolymers of allyl (meth)acrylate/(meth)acrylic acid/optional other addition-polymerizable vinyl monomers and alkali metal salts and amine salts thereof as disclosed in J.P. KOKAI No. Sho 59-53836; reaction products of hydroxyethyl (meth)acrylate/(meth)acrylic acid/alkyl (meth) acrylate copolymers or alkali metal or amine salts thereof with (meth)acrylic acid chloride as disclosed in J.P. KOKOKU No. Sho 59-45979; reaction products of maleic anhydride copolymers with pentaerythritol triacrylate through the half-esterification and alkali metal or amine salts thereof as disclosed in J.P. KOKAI No. Sho 59-71048; reaction products of styrene/maleic anhydride copolymers with monohydroxyalkyl (meth)acrylate, polyethylene glycol mono(meth) acrylate or polypropylene glycol mono(meth)acrylate through the half-esterification and alkali metal or amine salts thereof; reaction products obtained by reacting a part of carboxyl groups of (meth) acrylic acid copolymers or crotonic acid copolymers with glycidyl (meth)acrylate and alkali metal or amine salts thereof; reaction products of hydroxyalkyl (meth)acrylate copolymers, polyvinyl formals or polyvinyl butyrals with maleic anhydride or itaconic anhydride and alkali metal or amine salts thereof; products obtained through reaction of hydroxyalkyl (meth)acrylate/(meth)acrylic acid copolymers with 1:1 adduct of 2,4-tolylene diisocyanate/hydroxyalkyl (meth) acrylate and alkali metal and amine salts thereof; product obtained through a reaction of a part of (meth)acrylic acid copolymers with allyl glycidyl ether and alkali metal and amine salts thereof as disclosed in J.P. KOKAI No. Sho 59-53836; vinyl (meth)acrylate/(meth) acrylic acid copolymers and alkali metal and amine salts thereof; allyl (meth)acrylate/sodium styrenesulfonate copolymers; vinyl (meth) acrylate/sodium styrenesulfonate copolymers; allyl (meth) acrylate/sodium acrylamido-1,1-dimethylethylenesulfonate copolymers; vinyl (meth)acrylate/sodium acrylamido-1,1-dimethylethylenesulfonate copolymers; 2-allyloxyethyl methacrylate/methacrylic acid copolymers; and 2-allyloxyethyl methacrylate/2-methacryloxyethyl hydrogen succinate copolymers.

The polymeric compounds may be used alone or in combination in an amount ranging from 30 to 99% by weight and preferably 50 to 97% by weight on the basis of the total weight of the light-sensitive resin layer.

Component (iii): Photopolymerization Initiators

Examples of such photopolymerization initiators are vicinal polyketaldonyl compounds as disclosed in U.S. Pat. No. 2,367,660; α carbonyl compounds as disclosed in U.S. Pat. Nos. 2,367,661 and 2,367,670; acyloin ethers as disclosed in U.S. Pat. No. 2,448,828; aromatic acyloin compounds which are substituted with an α-hydrocarbon as disclosed in U.S. Pat. No. 2,722,512; polynuclear quinone compounds as disclosed in U.S. Pat. Nos. 3,046,127 and 2,951,758; a combination of triarylimidazole dimer/p-aminophenyl ketone as disclosed in U.S. Pat. No. 3,549,367; benzothiazole compounds as disclosed in U.S. Pat. No. 3,870,524; combinations of benzothiazole compounds/trihalomethyl-s-triazine compounds as disclosed in U.S. Pat. No. 4,239,850; acridine and phenazine compounds as disclosed in U.S. Pat. No. 3,751,259; oxadiazole compounds as disclosed in U.S. Pat. No. 4,212,970; trihalomethyl-s-triazine compounds carrying chromophoric groups as disclosed in U.S. Pat. Nos. 3,954,475 and 4,189,323 and J.P. KOKAI Nos. Sho 53-133428, Sho 60-105667, Sho 62-58241 and Sho 63-153542; and benzophenone group-containing peroxyester compounds as disclosed in J.P. KOKAI Nos. Sho 59-197401 and Sho 60-76503, which may be used alone or in any combination thereof.

The amount of these photopolymerization initiators ranges from 0.1 to 20% by weight and preferably 1 to 10% by weight on the basis of the total weight of the light-sensitive resin layer.

Other Components

In addition to the foregoing components, the light-sensitive resin layer may further comprise a small amount of a photohardenable diazo resin for improving the adhesion to the primer layer. Examples of the diazo resins are those disclosed in U.S. Pat. Nos. 3,867,147 and 2,632,703 and in particular, diazo resins represented by condensates of aromatic diazonium salts with active carbonyl group-containing compounds (such as formaldehyde) are effectively used in the invention. Preferred examples thereof include hexafluorophosphates, tetrafluoroborates or phosphates of condensates of p-diazophenylamine and formaldehyde or acetaldehyde. In addition, preferred examples thereof also include sulfonates (such as p-toluenesulfonates, dodecylbenzenesulfonates and 2-methoxy-4-hydroxy-5-benzoylbenzenesulfonates), phosphinates and organic carbonates of condensates of p-diazodiphenylamine with formaldehyde as disclosed in U.S. Pat. No. 3,300,309. These diazo resins may be used alone or in any combination thereof and the amount thereof preferably ranges from 0.1 to 5% by weight on the basis of the total weight of the light-sensitive resin layer.

Moreover, the light-sensitive resin layer preferably comprises at least one heat polymerization inhibitor. Examples of useful such heat polymerization inhibitors are hydroquinone, p-methoxyphenol, dit-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and 2-mercaptobenzimidazole.

The light-sensitive resin layer may also comprise dyes and/or pigments for coloring the light-sensitive resin layer and pH indicators and/or Leuco dyes as printing out agents. The lightsensitive resin layer may comprise a small amount of a silicone compound selected from the group consisting of polydimethylsiloxane, methylstyrene-modified polydimethylsiloxane, olefin-modified polydimethylsiloxane, polyether-modified polydimethylsiloxane, silane coupling agents, silicone diacrylate and/or silicone dimethacrylate. In addition, a fluorine atom-containing surfactant or a fluorine atom-containing surface orienting agent may be added to the light-sensitive layer for enhancing the coating properties thereof. The amount of these additives to be added to the light-sensitive layer is in general not more than 10% by weight on the basis of the total weight of the light-sensitive resin layer. Moreover, the light-sensitive resin layer may optionally comprise silica powder or hydrophobic silica powder whose surface is treated with a (meth) acryloyl group or allyl group-containing silane coupling agent in an amount of not more than 50% by weight on the basis of the total weight of the light-sensitive resin layer.

(B) Photodimerizable Light-Sensitive Layer

The layers of this type include those obtained from polymeric compounds having, on the side chains or in the main chain thereof, a group represented by the following structural or general formula:

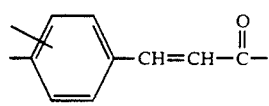

or

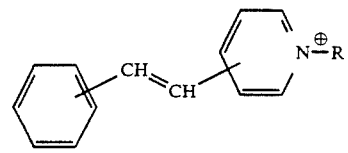

(wherein R represents an alkyl group having 1 to 10 carbon atoms);

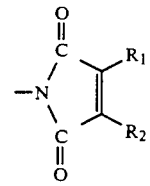

(wherein $R_1$ and $R_2$ each independently represents an alkyl group or $R_1$ and $R_2$ may be bonded to form a 5-membered or 6-membered ring); or

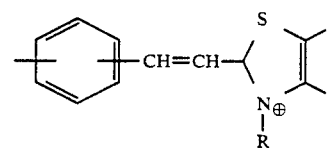

(wherein R represents an alkyl group having 1 to 10 carbon atoms).

Specific examples thereof include those mainly comprising a light-sensitive polymer such as polyesters, polyamides or polycarbonates having, in the main chain or on the side chains thereof, a group represented by the following formula:

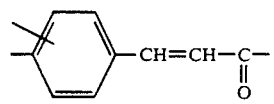

as a light-sensitive group (for instance, those disclosed in U.S. Pat. Nos. 3,030,208, 3,707,373 and 3,453,237); those mainly comprising light-sensitive polyesters derived from (2-propelidene) malonic acid compounds such as cinnamylidene malonic acid and bifunctional glycols (for instance, light-sensitive polymers disclosed in U.S. Pat. Nos. 2,956,878 and 3,173,737); cinnamates of hydroxyl group-containing polymers such as polyvinyl alcohols, starches, celluloses or homologues thereof (for instance, light-sensitive polymers disclosed in U.S. Pat. Nos. 2,690,966, 2,752,372 and 2,732,301); and polymers disclosed in J.P. KOKAI Nos. Sho 58-25302 and Sho 59-17550.

(C) Composition Comprising Photohardenable Diazo Resin or Azide Resin, Optional Sensitizer and Some Fillers or Additives Examples of such photohardenable diazo resins are zinc chloride complex salts of condensates of diazo amines such as p-diazodiphenylamine, p-diazomonoethylaniline and p-diazobenzylethylaniline with formaldehyde.

The light-sensitive resin layer of this type essentially differs from the light-sensitive resin layer listed above in connection with the foregoing item (A) in that it does not contain any compound carrying a photopolymerizable unsaturated double bond. Examples of the photohardenable azide resins are azidophthalate or azidobenzoate of polyvinyl alcohol and esters of styrene-maleic anhydride copolymers with aromatic azide alcohols such as β-(4-azidophenol)ethanol.

The light-sensitive resin layer may further comprise sensitizers, fillers, additives or the like and specific examples thereof are the same as those listed above in connection with the foregoing item (A).

(D) Composition Comprising o-Quinonediazide Compound

Particularly preferred examples of the o-quinonediazide compounds are o-naphthoquinone compounds as disclosed in a variety of publications such as U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709; and 3,647,443 and these compounds can preferably be used in the light-sensitive resin layer. Particularly preferred are o-naphthoquinonediazidosulfonates or o-naphthoquinonediazidocarboxylates of aromatic hydroxy compounds and o-naphthoquinonediazidosulfonic acid amides or o-naphthoquinonediazid ocarboxylic acid amides of aromatic amino compounds and specific examples thereof include esters of benzoquinone-1,2-diazidosulfonic acid or naphthoquinone-1,2-diazidosulfonic acid with polyhydroxypheny 1 (hereunder the term "ester" also includes partial esters); esters of naphthoquinone-1,2-diazido-4-sulfonic acid or naphthoquinone-1,2-diazido-5-sulfonic acid with pyrogallol/acetone resins; esters of benzoquinone-1,2-diazidosulfonic acid or naphthoquinone-1,2-diazidosulfonic acid with novolak type phenol/formaldehyde resins or novolak type cresol/formaldehyde resins; amides of poly(p-aminostyrene) with naphthoquinone-1,2-diazido-4-sulfonic acid or naphthoquinone-1,2-diazido-5-sulfonic acid; esters of poly(p-hydroxystyrene) with naphthoquinone-1,2-diazido-4-sulfonic acid or naphthoquinone-1,2-diazido-5-sulfonic acid; esters of polyethylene glycol with naphthoquinone-1,2-diazido-4-sulfonic acid or naphthoquinone-1,2-diazido-5-sulfonic acid; amides of polymeric amines with naphthoquinone-1,2-diazido-4-sulfonic acid or naphthoquinone-1,2-diazido-5-sulfonic acid; esters of polymethacrylic acid p-hydroxyanilide with naphthoquinone-1,2-diazido-4-sulfonic acid or naphthoquinone-1,2-diazido-5-sulfonic acid; amides of amine-modified rosin, as a natural resin, with naphthoquinone-1,2-diazido-4-sulfonic acid or naphthoquinone-1,2-diazido-5-sulfonic acid; esters of epoxy resins (obtained from bisphenol A and propylene oxide) with naphthoquinone-1,2-diazido-4-sulfonic acid or naphthoquinone-1,2-diazido-5-sulfonic acid; esters of copolymers of (meth)acrylic acid and dihydroxyphenyl monoester with naphthoquinone-1,2-diazido-4-sulfonic acid or naphthoquinone-1,2-diazido-5-sulfonic acid; Polymerization products of condensates of diallyl aminoisophthalate with naphthoquinonediazidosulfonic acid; products obtained by crosslinking quinonediazidosulfonates or guinonediazides with isocyanate or the like; esters of bisphenol A with naphthoquinone-1,2-diazido-4-sulfonic acid or naphthoquinone-1,2-diazido-5-sulfonci acid; esters of naphthoquinone-1,2-diazido-4-sulfonic acid or naphthoquinone-1,2-diazido-5-sulfonic acid with phenols such as phenol and p-cresol, or alcohols such as ethyl alcohol, propyl alcohol, butyl alcohol and amyl alcohol; and acid amides of naphthoquinone-1,2-diazido-4-sulfonic acid or naphthoquinone-1,2-diazido-5-sulfonic acid with amines such as aniline and p-hydroxyaniline.

The foregoing compositions for forming light-sensitive layers may further comprise a surfactant such as those described in U.S. Pat. Nos. 3,787,351; 4,487,823 and 4,822,713; and the resulting compositions are dissolved in a proper solvent selected from the group consisting of, for instance, 2-methoxyethanol, 2-methoxyethyl acetate, methyl lactate, ethyl lactate, propylene glycol monomethyl ether, methanol, ethanol, methyl ethyl ketone, water and mixture thereof and then applied onto the surface of a substrate. The amount of the composition to be applied desirably ranges from about 0.1 to 10 g/m$^2$ and preferably 0.5 to 5 g/m$^2$ (weighed after drying).

The thickness of the silicone rubber layer desirably ranges from 0.5 to 50μm, preferably 0.5 to 5μm. Examples of useful silicone rubbers are those obtained from a so-called condensed silicone rubber composition mainly comprising a linear organopolysiloxane (preferably dimethylpolysiloxane) which causes crosslinking through condensation of terminal groups thereof and has a molecular weight of 100 to 100,000; or a so-called addition type silicone rubber composition wherein a crosslinking agent having methyl hydrogen siloxane units is reacted with a linear organopolysiloxane having, at both ends or in the main chain, vinyl groups.

The silicone rubber layer exhibits ink repellency, the surface thereof has a slight adhesion and thus dusts or the like are liable to adhere to the surface. For this reason, a positive film is not satisfactorily adhered thereto during the process for exposing a PS plate to light. Accordingly, a thin transparent protective film may be applied onto the surface of the silicone rubber layer. As has been explained above, the protective film is effective in the exposure process,-but is needless in the printing process and thus is removed from the silicone rubber layer prior to the developing process by peeling off or dissolving the same. Useful protective films have transparency for enabling ultraviolet rays to pass therethrough and a thickness of not more than 100μm, preferably not more than 10μm. Typical examples thereof include polyethylene, polypropylene, polyvinyl chloride, polyvinylidene chloride, polyvinyl alcohol, polyethylene terephthalate and cellophane films.

Moreover, in order to enhance the speed of adhesion of a positive film to the surface of the protective film in a vacuum printing frame, dot patterns can be formed on the surface of the protective film as disclosed in J.P. KOKOKU No. Sho 61-11673.

The PS plates requiring no dampening water thus prepared is in general brought into close contact with a positive film under vacuum using a vacuum printing frame for lithographic plates and then irradiated with actinic rays through the positive film. If a Protective film is applied, it is first removed from the silicone rubber layer and then the surface of the exposed PS plate is rubbed with a soft pad such as gauze or non-woven fabric containing the developer of the present invention to substantially remove the silicone rubber layer on the image areas and to hence expose the light-sensitive layer, the primer layer or the surface of the substrate on the image areas.

The exposed light-sensitive layer, the primer layer or the surface of the substrate on the image areas may, if necessary, be dyed with a dyeing solution as described in J.P. KOKAI No. Sho 54-103103.

The treatment described above may be performed by a plate-conveying automatic developing machine. The automatic developing machine comprises a developing area and optionally a dyeing area and each area is provided with rotary brushes. Preferably, the rotary brushes disposed in the developing area is rotated in the forward direction with respect to the plate-conveying direction and oscillated in the direction of rotation of the axis. Preferably, the rotary brushes disposed in the dyeing area is rotated in the direction opposite to the plate-conveying direction. The developer and the dyeing solution each is sprayed onto the surface of the plate in the developing or dyeing area through a spray pipe.

If the developer of the present invention is employed, foaming is hardly observed during treating a PS plate requiring no dampening water, the developer can ensure excellent developability and half tone dot reproduction and there can be provided an excellent lithographic printing plate requiring no dampening water free of defects such as scratch marks.

The developer of the present invention will hereunder be explained in more detail with reference to the following non-limitative working Examples and the effects practically achieved by the present invention will also be discussed in detail in comparison with Comparative Examples given below. In the following Examples and Comparative Examples, the term "%" means "% by weight" unless otherwise specified.

EXAMPLE 1

A smooth aluminum plate which had been degreased in the usual manner and treated with an aqueous solution of sodium silicate was treated with a 0.1% aqueous solution of γ-aminopropyltrimethoxysilane for 10 seconds and heated to 140° C. for one minute to dry the same. Then the aluminum plate was coated with a titanium white dispersion having the following formulation in an amount of 4.0 g/m² (weighed after drying) to form a primer layer.

Titanium White Dispersion

| Component | Amount (part by weight) |
| --- | --- |
| PARAPRENE P26SRNAT (available from NIPPON POLYURETHANE CO., LTD.) | 10 |
| TYPEKE R-782 (available from ISHIHARA INDUSTRIES, LTD.) | 1 |
| methyl ethyl ketone | 60 |
| dimethylsulfoxide | 20 |

The following photopolymerizable light-sensitive composition was applied onto the aluminum plate, on which the primer layer had been applied, in an amount of 2.0 g/m² (weighed after drying) to form a light-sensitive layer.

Light-Sensitive Composition

| Component | Amount (part by weight) |
| --- | --- |
| polyurethane comprising polyester diol of adipic acid with ethylene glycol and 1,4-butanediol; 1,4-butanediol; and isophoronediisocyanate | 2 |
| addition-reaction product of glycidyl methacrylate and xylylenediamine (4:1 molar ratio) | 0.45 |
| $CH_2=CH-CO-O-(CH_2CH_2O)_4-COCH=CH_2$ | 0.45 |
| compound of the following formula: | 0.1 |

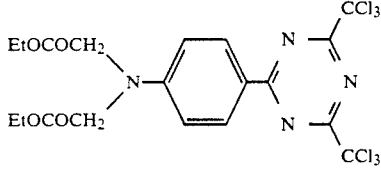

| | |
| --- | --- |
| Defenser MCF (fluorine atom-containing surfactant; available from DIANIPPON INK & CHEMICALS, INC.) | 0.1 |
| Bromophenol Blue (pH indicator) | 0.01 |
| propylene glycol monomethyl ether | 45 |
| methyl ethyl ketone | 7 |

Then the following silicon rubber composition was applied onto the foregoing light-sensitive layer in an amount of 2.0 g/m² (weighed after drying) to form a hardened silicone rubber layer.

Silicone Rubber Composition

| Component | Amount (part by weight) |
| --- | --- |
| polydimethylsiloxane having hydroxyl groups on both ends thereof (molecular weight: about 70,000) | 90 |
| methyltriacetoxysilane | 3 |
| dibutyl tin dioctanoate | 1 |
| Isopar G (available from ESSO CHEMICAL CO., LTD.) | 1 |

The silicone rubber layer thus formed was laminated with a one-side matted OPP (biaxially oriented polypropylene) film having a thickness of 9 μm to form a PS plate requiring no dampening water. A positive film was put on the PS plate requiring no dampening water thus obtained to come in close contact with one another, the assembly was imagewise exposed to light by the usual exposure apparatus, the laminate film was peeled off, the exposed PS plate was immersed in the following aqueous developer for one minute and the PS plate was lightly rubbed with a developing pad for 1 to 2 minutes to thus remove only the silicone rubber layer on the non-exposed portions.

Developer

| Component | Amount (part by weight) |
|---|---|
| diethylene glycol mono-n-hexyl ether | 15 |
| diethylene glycol monoethyl ether | 17 |
| pure water | 68 |

The lithographic printing plate requiring no dampening water thus obtained was fitted to "LISRON PRINTING PRESS" (available from KOMORI PRINTING PRESS MANUFACTURING CO., LTD.) from which the device for supplying dampening water was dismantled and printing operation was performed. As a result, good copies of 50,000 or more could be obtained.

EXAMPLE 2

A positive film was put on a PS plate TAP requiring no dampening water (available from Toray Industries, Ltd.) which comprised a substrate provided thereon with a light-sensitive layer and a silicone rubber layer to come in close contact with one another under vacuum, then the assembly was imagewise exposed to light with the usual exposure apparatus and a laminate film was removed from the exposed plate. A first bath and a second bath of an automatic developing machine for PS plates requiring no dampening water TWL 860 (available from Toray Industries, Ltd.) were filled with a developer having the following composition and the temperatures of the first and second baths were controlled to 35° C. and room temperature respectively to treat the exposed PS plate. Thus, there was obtained a lithographic printing plate requiring no dampening water in which only the silicone rubber layer on the non-exposed areas was removed and on which the images carried by the positive film were faithfully reproduced.

Developer

| Component | Amount (part by weight) |
|---|---|
| diethylene glycol mono-n-hexyl ether | 3.5 |
| triethyl phosphate | 6.5 |
| pure water | 90 |

Moreover, a third bath of the automatic developing machine was filled with a dyeing solution PA-2 (available from Toray Industries, Ltd.) and the developed PS plate was dyed immediately after the developing treatment. Thus, an excellent lithographic printing plate was obtained with good plate-examining properties.

The height of foam generated during the operation of the automatic developing machine did not exceed 1 cm.

COMPARATIVE EXAMPLE 1

According to the same manner used in Example 2, the first and second baths of the automatic developing machine TWL 860 were filled with the following aqueous developer and an imagewise exposed TAP was treated. The developer caused severe foaming and it overflowed from the developing bath.

However, the reproduction of images was the same as the observed in Example 2.

Developer

| Component | Amount (part by weight) |
|---|---|
| diethylene glycol mono-n-hexyl ether | 10 |
| Newcole B4SN (60% aqueous solution; available from NIPPON EMULSIFYING AGENT CO., LTD.) having the following structural formula: | 4.5 |

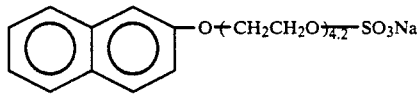

| | |
|---|---|
| pure water | 85.5 |

EXAMPLES 3 TO 6

According to the same manner used in Example 2, the first and second baths of the automatic developing machine TWL 860 were filled with the following aqueous developer 3-6 and an imagewise exposed TAP was treated. The reproduction of images in all of Examples 3 to 6 was very good as in Example 2.

Developer 3-6

| Component | Amount (part by weight) |
|---|---|
| diethylene glycol mono-n-hexyl ether | 6 |
| Y (see Table 1) | X (see Table 1) |
| pure water | 94 − X |

TABLE 1

| Ex. No. | Y | X |
|---|---|---|
| 3 | propylene glycol | 22 |
| 4 | tripropylene glycol | 12 |
| 5 | 1,3-butanediol | 14 |
| 6 | 1,5-pentanediol | 9 |

EXAMPLE 7

The following composition for a primer layer was applied onto the surface of a smooth aluminum plate which had been degreased in the usual manner in an amount of 8.0 g/m² (weighed after drying) and then heated to 120° C. for 3 minutes to dry and harden the resulting film.

Preparation of the Composition for Primer Layer

A solution containing 450 parts by weight of pure water and 2.6 parts by weight of anhydrous sodium carbonate was heated to 70° C., 50 parts by weight of powdery casein lactate (New Zealand growth; available from Murray Coulburn Cooperative Co., Ltd.) was added to the solution with stirring to dissolve the casein. Then the following components were added to the foregoing aqueous casein solution to form a composition for forming a primer layer.

| Component | Amount (part by weight) |
|---|---|
| SBR latex (Nipol LX 110 (solid content: 40.5%); Tg = −60° C.; available from Nippon Zeon Co., Ltd.) | 50 (reduced amount of solid contents) |
| Quinoline Yellow WS (yellow dye available from Chugai Chemical Co., Ltd.) | 0.5 |

-continued

| Component | Amount (part by weight) |
|---|---|
| Nickole OTP-100S (anionic surfactant available from Nickole Chemical Co., Ltd.) | 1.2 |
| γ-glycidoxypropyltrimethoxysilane | 3.0 |
| $CH_2=CHSO_2CH_2CH(OH)CH_2SO_2CH=CH_2$ | 3.0 |
| pure water | 100 |

Then the following light-sensitive composition was applied onto the primer layer thus formed so that the coated amount thereof was equal to 3.0 g/m² (weighed after drying) and heated to 100° C. for one minute to dry the same.

Light-Sensitive Composition

| Component | Amount (part by weight) |
|---|---|
| 2-allyloxyethyl methacrylate/2-methacryloxy hydrogen succinate (90/10 mole %) copolymer | 2 |
| $(CH_2=CHCOOCH_2CH(OH)CH_2OCH_2)_2-CHOH$ | 0.3 |
| compound of the following formula: | 0.2 |

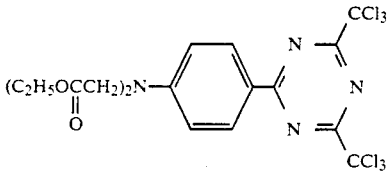

| | |
|---|---|
| Phenol Cresol Blue (pH indicator) | 0.01 |
| Defenser MCF323 (available from DAINIPPON INK & CHEMICALS, INC.) | 0.02 |
| $PF_6$ salt of p-diazodiphenylamine/formaldehyde condensate | 0.02 |
| propylene glycol monomethyl ether | 15 |
| methyl ethyl ketone | 10 |

The following composition for silicone rubber layers was applied onto the surface of the resulting light-sensitive layer in an amount of 2.0 g/m² (weighed after drying) and heated to 140° C. for 2 minutes to dry the same and to thus form a hardened silicone rubber layer.

Composition for Silicone Rubber Layer

| Component | Amount (part by weight) |
|---|---|
| poly(α, ω-divinyldimethylsiloxane) (degree of polymerization: about 700) | 9 |
| compound of the following formula: | 1 |

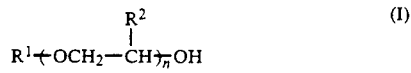

| | |
|---|---|
| compound of the following formula: | 0.2 |

$$[(CH_2\!\!-\!\!\!\overset{O}{\diagdown\diagup}\!\!\!-\!\!CHCH_2OC_3H_6(CH_3)SiO](SiO)_3 \atop H$$

| | |
|---|---|
| polydimethylsiloxane (degree of polymerization about 8,000) | 0.5 |
| olefin-chloroplatinic acid | 0.2 |
| inhibiting agent | 0.15 |
| Isopar G (available from ESSO CHEMICAL CO., LTD.) | — |

A one-side matted polypropylene film having a thickness of 9μm was laminated with the silicone rubber layer thus formed to obtain a PS plate requiring no dampening water. A positive film was put on the PS plate to come in close contact with one another, the assembly was imagewise exposed to light with FT 26V UDNS ULTRA-PLUS FLIP-TOP PLATE MAKER (available from Nu Arc Co., Ltd.) for 30 counts, the laminate film was peeled off and then the imagewise exposed plate was developed in the same manner used in Example 2. Thus, only the light-sensitive layer and the silicone rubber-layer on the non-exposed portions were removed and the exposed primer layer was dyed. As a result, there was obtained a lithographic printing plate on which the images of the positive-film were faithfully reproduced over the entire surface of the plate.

What is claimed is:

1. A process of preparing a lithographic printing plate requiring no dampening at a press operation, which comprises the steps of, in order, (a) imagewise exposing to light a presensitized plate comprising a substrate having (A) a photo-sensitive layer comprising (i) a monomer or an oligomer having an olefinically unsaturated double bond, (ii) a film-forming polymeric binder and (iii) a photopolymerization initiator and (B) a silicone rubber layer, in this order, and (b) developing the imagewise light-exposed presensitized plate with a developer to remove only the silicone rubber layer in a light-unexposed area to reveal a surface of the photosensitive layer in said area comprising (1) 1 to 39% by weight of at least one alcohol derivative selected from the group consisting of those represented by the following general formula (I):

$$R^1\!\!-\!\!(OCH_2\!\!-\!\!CH)_n\!\!-\!\!OH \atop R^2 \qquad (I)$$

(wherein $R^1$ represents an alkyl or alkenyl group having 4 to 12 carbon atoms; $R^2$ represents a hydrogen atom or a methyl group; and n is an integer ranging from 1 to 6);

(2) 1 to 39% by weight of at least one water-soluble organic solvent having a boiling point of not less than 100° C., said water soluble organic solvent being selected from the group consisting of glycerin, ethylene glycol, diethylene glycol, propylene glycol, dipropylene glycol, tripropylene glycol, diethylene glycol monomethyl ether, diethylene glycol monoethyl ether, 1,2-butanediol, 1,3-butanediol, 1,4-butanediol, 1,5-pentanediol, triethylphosphate, methyl lactate and ethyl lactate; and (3) 60 to 98% by weight of water, to remove the silicone rubber layer in the light-unexposed area, thereby obtaining the lithographic plate.

2. The process of claim 1 wherein said presensitized plate further comprises a primer layer between the substrate and the light-sensitive layer and a protective film on the silicone rubber layer, and said steps further comprising a step of removing the protective film after the step (a) but prior to the step (b).

3. The process of claim 2, wherein said primer layer comprises an epoxy resin, a urethane resin, a phenol resin, an acrylic resin, an alkyd resin, a polyester resin, a polyamide resin or a melamine resin.

4. The process of claim 2, wherein said primer layer has a thickness in a range of from 1 to 50 g/m² expressed in terms of coated amount of the primer layer.

5. The process of claim 1, wherein the alcohol derivative (1) is at least one member selected from the group consisting of diethylene glycol-mono-n-pentyl ether, diethylene glycol-mono-n-hexyl ether, diethylene glycol-mono-n-heptyl ether, diethylene glycol-mono-octyl ether, ethylene glycol-mono-n-pentyl ether, ethylene glycol-mono-n-hexyl ether, ethylene glycol-mono-n-heptyl ether, ethylene glycol-mono-octyl ether, propylene glycol-mono-butyl ether, propylene glycol-monopentyl ether, propylene glycol-mono-n-hexyl ether, propylene glycol-mono-heptyl ether, propylene glycol-mono-octyl ether, dipropylene glycol-mono-butyl ether, dipropylene glycol-mono-pentyl ether, dipropylene glycol-mono-n-hexyl ether, dipropylene glycol-mono-octenyl ether and dipropylene glycol-mono-octyl ether.

6. The process of claim 1, wherein the alcohol derivative (1) is diethylene glycol-mono-n-hexyl ether.

7. The process of claim 6, wherein the water-soluble organic solvent (2) is diethylene glycol-mono-ethyl ether.

8. The process of claim 1, wherein said developer further comprises a dye.

9. The process of claim 8, wherein said dye is Crystal Violet or Astrazone Red.

10. The process of claim 1, wherein said developer further comprises a surfactant as a solubilizing agent for said alcohol derivative.

11. The process of claim 10, wherein said surfactant is an anionic surfactant.

12. The process of claim 10, wherein an amount of the surfactant ranges from 0.01 to 20% by weight on the basis of the total weight of the developer.

13. The process of claim 1, wherein said developer further comprises at least one selected from the group consisting of an organic acid and an amine compound.

14. The process of claim 13, wherein said organic acid is at least one selected from the group consisting of propionic acid, n-butyric acid, iso-butyric acid, n-valeric acid, iso-valeric acid, methyl ethyl acetic acid, trimethyl acetic acid, caproic acid, isocaproic acid, α-methyl valeric acid, 2-ethyl-n-butyric acid, enanthic acid, caprylic acid and 2-ethyl-hexanoic acid.

15. The process of claim 13, wherein said amine compound is at least one selected from the group consisting of methylamine, ethylamine, diethylamine, trimethylamine, triethylamine, propylamine, butylamine, amylamine, dipropylamine, dibutylamine, diamylamine, tripropylamine, tributylamine, methyldiethylamine, ethylenediamine, trimethylenediamine, tetramethylenediamine, benzylamine, N,N-dimethylbenzylamine, N,N-diethylbenzylamine, o-, m- and p-methoxy (or methyl) benzylamine, N,N-di-(methoxybenzyl)amine, β-phenylethylamine, γ-phenylpropylamine, cyclohexylamine, α- and β-naphthylamine, o-, m- and p-phenylenediamine, monoethanolamine, diethanolamine, triethanolamine, 2-methylaminoethanol, 2-ethylaminoethanol, 2-(2-aminoethyl)ethanol, 2-amino-2-methyl-1,3-propanediol, 2-amino-1,3-propanediol, 2-amino-2-hydroxymethyl-1,3-propanediol, 3-methoxypropylamine, 3-ethoxypropylamine, 3-proproxypropylamine, 3-isopropoxypropylamine, 3-butoxypropylamine, 3-isobutoxypropylamine, 2-ethylhexyloxypropylamine, 2-ethoxyethylamine, 2-propoxyethylamine and 2-butoxyethylamine.

16. The process of claim 1, wherein amounts of the monomer or the oligomer, the film forming polymeric binder and the photopolymerization initiator are in a range of from 70 to 1%, 50 to 97%, and 1 to 10%, respectively, by weight on the basis of the total weight of the light-sensitive resin layer.

17. The process of claim 1, wherein said silicone rubber layer has a thickness in a range of from 0.5 to 5 μm.

* * * * *